United States Patent
Yen et al.

(10) Patent No.: US 9,954,447 B2
(45) Date of Patent: Apr. 24, 2018

(54) POWER SUPPLY APPARATUS

(71) Applicants: LITE-ON ELECTRONICS (GUANGZHOU) LIMITED, Guangzhou (CN); LITE-ON TECHNOLOGY CORP., Taipei (TW)

(72) Inventors: Ming-Chuan Yen, Taipei (TW); Chih-Hua Kung, Taipei (TW)

(73) Assignees: Lite-On Electronics (Guangzhou) Limited, Guangzhou (CN); Lite-On Technology Corp., Taipei (TW)

(*) Notice: Subject to any disclaimer, the term of this patent is extended or adjusted under 35 U.S.C. 154(b) by 22 days.

(21) Appl. No.: 15/155,231

(22) Filed: May 16, 2016

(65) Prior Publication Data
US 2017/0201179 A1 Jul. 13, 2017

Related U.S. Application Data

(60) Provisional application No. 62/278,027, filed on Jan. 13, 2016.

(51) Int. Cl.
| | |
|---|---|
| H02M 3/335 | (2006.01) |
| H02M 1/42 | (2007.01) |
| H02M 1/44 | (2007.01) |
| H02M 1/00 | (2006.01) |
| H02M 1/08 | (2006.01) |
| H03K 5/00 | (2006.01) |
| H03K 17/687 | (2006.01) |

(52) U.S. Cl.
CPC ......... *H02M 3/33507* (2013.01); *H02M 1/08* (2013.01); *H02M 1/42* (2013.01); *H02M 1/44* (2013.01); *H02M 3/33523* (2013.01); *H03K 5/00006* (2013.01); *H03K 17/687* (2013.01); *H02M 2001/0009* (2013.01); *H02M 2001/0025* (2013.01); *Y02B 70/12* (2013.01)

(58) Field of Classification Search
CPC ............. H02M 3/33507; H02M 3/335; H02M 3/33523; H02M 3/33553; H02M 3/33546; H02M 1/42; H02M 1/44; H02M 2001/0009
See application file for complete search history.

(56) References Cited

U.S. PATENT DOCUMENTS

| | | | | |
|---|---|---|---|---|
| 6,944,034 B1* | 9/2005 | Shteynberg | ......... | H02M 1/4258 323/282 |
| 9,490,716 B2* | 11/2016 | Tseng | ................ | H02M 3/33592 |
| 9,584,032 B2* | 2/2017 | Tseng | ................ | H02M 3/33507 |

(Continued)

*Primary Examiner* — Timothy J Dole
*Assistant Examiner* — Sisay G Tiku
(74) *Attorney, Agent, or Firm* — Rosenberg, Klein & Lee

(57) ABSTRACT

A power supply apparatus includes a flyback converter and a controller. The controller generates, in response to an output voltage generated by the flyback converter and stabilized at a selected one of a plurality of voltage values, a control signal associated with the selection of the voltage values. Based at least on the output voltage and the control signal, the controller generates a feedback voltage associated with loading of the power supply apparatus, and controls a switch of the flyback converter in such a manner that the switch operates at a switching frequency associated with the feedback voltage, and that at least one of the feedback voltage or a curve of the switching frequency with respect to the feedback voltage changes due to the control signal.

19 Claims, 17 Drawing Sheets

(56) References Cited

U.S. PATENT DOCUMENTS

| | | | |
|---|---|---|---|
| 2006/0181230 A1* | 8/2006 | Hosotani | H02M 3/33569 318/136 |
| 2011/0080103 A1* | 4/2011 | Reed | H05B 33/0815 315/219 |
| 2013/0002746 A1* | 1/2013 | Takayanagi | B41J 29/38 347/14 |
| 2014/0177290 A1* | 6/2014 | Zhang | H02M 3/33507 363/21.13 |
| 2015/0070945 A1* | 3/2015 | Huang | H02H 7/1213 363/21.16 |
| 2016/0261198 A1* | 9/2016 | Li | H02M 1/15 |
| 2016/0329816 A1* | 11/2016 | Zhang | H02M 3/33507 |
| 2017/0187298 A1* | 6/2017 | Lin | H02M 3/33553 |

* cited by examiner

POWER SUPPLY APPARATUS

CROSS-REFERENCE TO RELATED APPLICATION

This application claims priority of U.S. Provisional Application No. 62/278,027, filed on Jan. 13, 2016.

FIELD

The disclosure relates to power conversion, and more particularly to a power supply apparatus.

BACKGROUND

A conventional power supply apparatus using a power factor corrector and a quasi-resonant flyback converter converts an AC (alternating current) input voltage into a DC (direct current) output voltage. The output voltage is stabilized at a selected one of multiple predetermined voltage values. A current provided by the conventional power supply apparatus is dependent on loading of the same. The conventional power supply apparatus cannot have relatively high conversion efficiency under various specific settings of the output voltage and the loading since the power supply apparatus is normally well-designed under certain output voltage.

SUMMARY

Therefore, an object of the disclosure is to provide a power supply apparatus that can alleviate the drawback of the prior art.

According to the disclosure, the power supply apparatus includes a flyback converter and a controller. The flyback converter receives a bulk voltage, generates an output voltage in response to the bulk voltage, and includes a transformer that includes a primary winding and a secondary winding, and a switch that is coupled to the primary winding. The output voltage is stabilized at a selected one of a plurality of predetermined voltage values. The controller is coupled to the flyback converter for receiving the output voltage therefrom, and generates, in response to the output voltage, a control signal associated with the selection of the predetermined voltage values. Based at least on the output voltage and the control signal, the controller generates a feedback voltage associated with loading of the power supply apparatus, and controls the switch in such a manner that the switch operates at a switching frequency associated with the feedback voltage, and that at least one of the feedback voltage or a curve of the switching frequency with respect to the feedback voltage changes due to the control signal.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
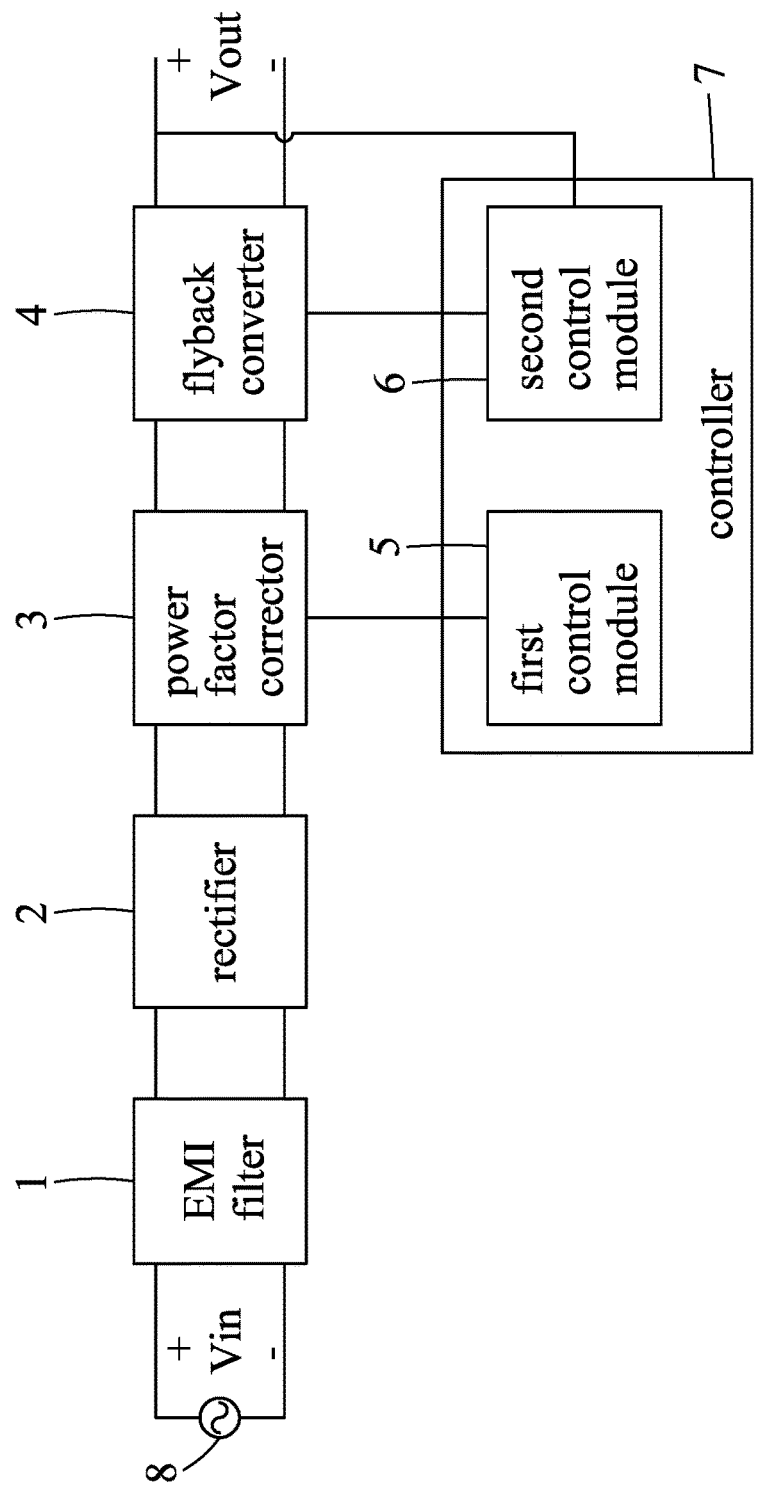
FIG. 1 is a block diagram illustrating a first embodiment of a power supply apparatus according to the disclosure.

Before the disclosure is described in greater detail, it should be noted that like elements are denoted by the same reference numerals throughout the disclosure.

Referring to FIG. 1, the first embodiment of a power supply apparatus according to the disclosure is used to be coupled to a power source 8 for receiving an AC (alternating current) input voltage (Vin) therefrom, and converts the input voltage (Vin) into a DC (direct current) output voltage (Vout). The power supply apparatus of this embodiment includes an EMI (electromagnetic interference) filter 1, a rectifier 2, a power factor corrector 3, a flyback converter 4 and a controller 7. The controller 7 includes a first control module 5 and a second control module 6.

The EMI filter 1 is used to be coupled to the power source 8 for receiving the input voltage (Vin) therefrom, and filters the input voltage (Vin) to generate a filtered voltage.

The rectifier 2 is coupled to the EMI filter 1 for receiving the filtered voltage therefrom, and rectifies the filtered voltage to generate a rectified voltage.

The power factor corrector 3 is coupled to the rectifier 2 and the first control module 5, and receives the rectified voltage from the rectifier 2. Under control of the first control module 5, the power factor corrector 3 generates a DC bulk voltage in response to the rectified voltage, and allows a current provided by the power source 8 to have a phase that follows a phase of the input voltage (Vin) provided by the same, thereby attaining a high power factor.

The flyback converter 4 is coupled to the power factor corrector 3 and the second control module 6, receives the bulk voltage from the power factor corrector 3, and generates the output voltage (Vout) in response to the bulk voltage under control of the second control module 6. The output voltage (Vout) is stabilized at a selected one of a plurality of predetermined voltage values (e.g., 5V and 20V). A current provided by the flyback converter 4 is dependent on loading of the power supply apparatus of this embodiment.

Figure 2:
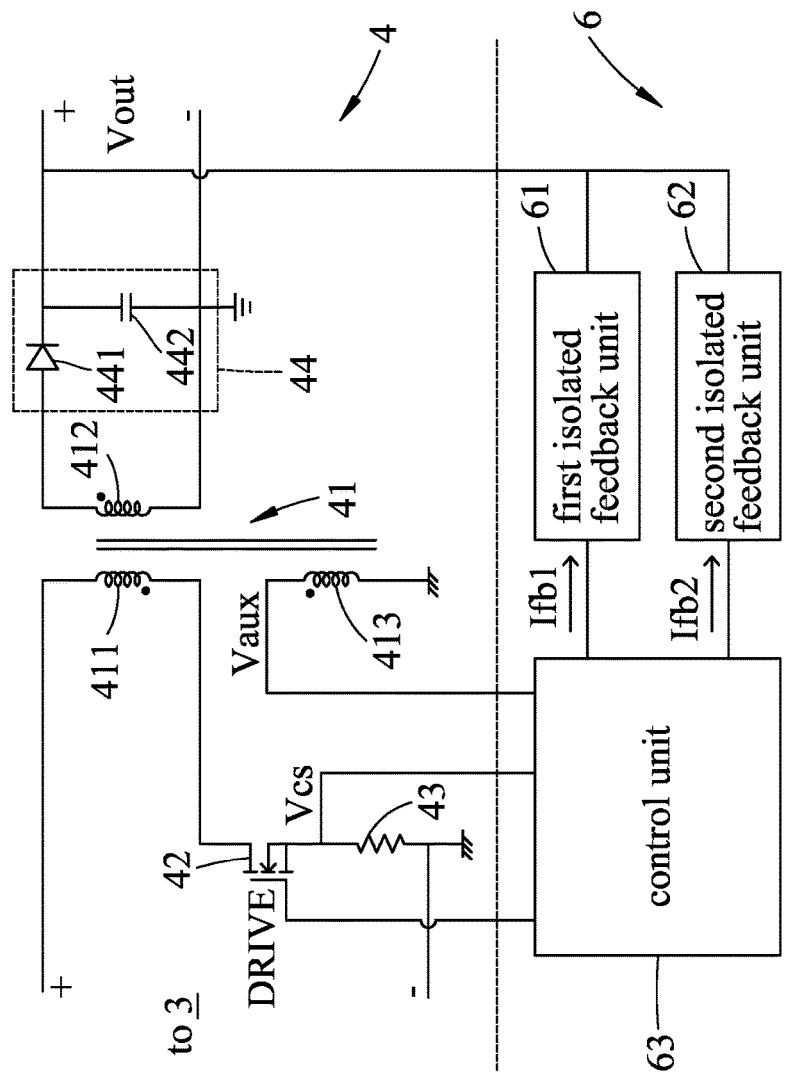
FIG. 2 is a circuit block diagram illustrating a flyback converter and a second control module of the first embodiment.

Referring to FIG. 2, the flyback converter 4 includes a transformer 41, a switch 42, a current sensing element 43 and a rectifying-and-filtering circuit 44.

The transformer 41 includes a primary winding 411, a secondary winding 412 and an auxiliary winding 413. The primary winding 411 has a first terminal and a second terminal. The secondary winding 412 has a first terminal, and a second terminal that is coupled to a grounded secondary reference node. The auxiliary winding 413 has a first terminal that provides an auxiliary voltage (Vaux), and a second terminal that is coupled to a grounded primary reference node. The first terminals of the primary, secondary and auxiliary windings 411, 412, 413 have the same voltage polarity.

The switch 42 and the current sensing element 43 are coupled in series between the first terminal of the primary winding 411 and the primary reference node, with the switch 42 coupled to the first terminal of the primary winding 411 and the current sensing element 43 coupled to the primary reference node. The series connection of the primary winding 411, the switch 42 and the current sensing element 43 is coupled to the power factor corrector 3 for receiving the bulk voltage therefrom. The current sensing element 43 senses a current flowing through the switch 42 to generate a sensed voltage (Vcs). In this embodiment, the switch 42 is an N-type metal oxide semiconductor field effect transistor, and the current sensing element 43 is a resistor.

The rectifying-and-filtering circuit 44 is coupled to the secondary winding 412, and rectifies and filters a voltage across the secondary winding 412 to generate the output voltage (Vout). In this embodiment, the rectifying-and-filtering circuit 44 includes a diode 441 that is used for rectification, and a capacitor 442 that is used for filtering. The diode 441 has an anode that is coupled to the first terminal of the secondary winding 412, and a cathode. The capacitor 442 is coupled between the cathode of the diode 441 and the second terminal of the secondary winding 412, and a voltage thereacross serves as the output voltage (Vout).

The second control module 6 includes a first isolated feedback unit 61, a second isolated feedback unit 62 and a control unit 63.

Figure 3:
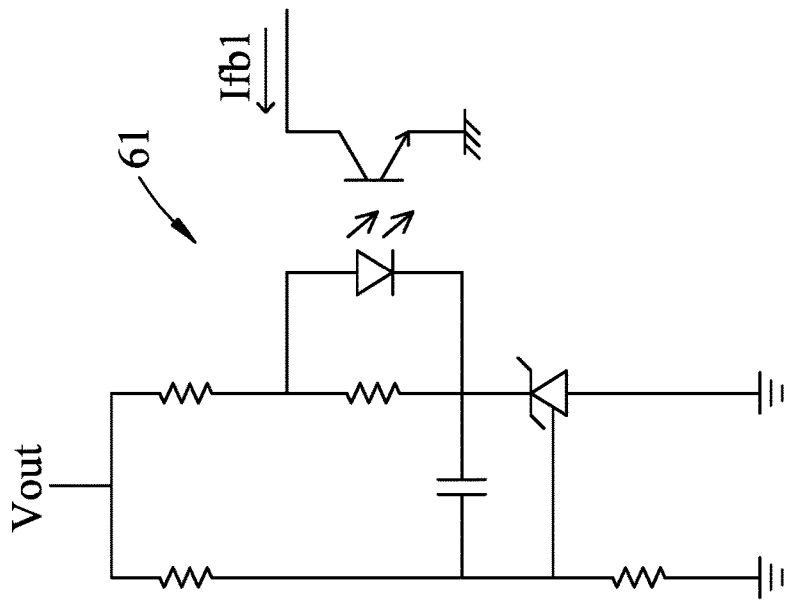
FIG. 3 is a circuit diagram illustrating a first isolated feedback unit of the second control module of the first embodiment.

The first isolated feedback unit 61 is coupled to the capacitor 442 for receiving the output voltage (Vout) therefrom, and generates, in response to the output voltage (Vout), a first feedback current input (Ifb1) associated with the loading of the power supply apparatus of this embodiment. In this embodiment, implementation of the first isolated feedback unit 61 is as shown in FIG. 3, in which the first feedback current input (Ifb1) decreases with increase of the loading.

Figure 4:
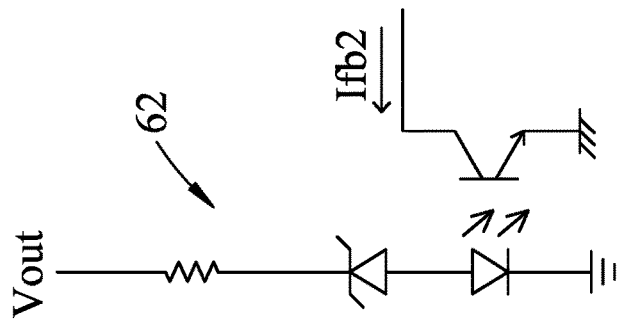
FIG. 4 is a circuit diagram illustrating a second isolated feedback unit of the second control module of the first embodiment.

The second isolated feedback unit 62 is coupled to the capacitor 442 for receiving the output voltage (Vout) therefrom, and generates, in response to the output voltage (Vout), a second feedback current input (Ifb2) associated with the selection of the predetermined voltage values. In this embodiment, implementation of the second isolated feedback unit 62 is as shown in FIG. 4, in which the second feedback current input (Ifb2) is non-zero when the output voltage (Vout) is higher than a predetermined voltage threshold (e.g., 10V), and is zero (i.e., no current) when the output voltage (Vout) is lower than the predetermined voltage threshold.

The control unit 63 is coupled to the auxiliary winding 413, the switch 42, the current sensing element 43 and the first and second isolated feedback units 61, 62, and receives the auxiliary voltage (Vaux), the sensed voltage (Vcs) and the first and second feedback current inputs (Ifb1, Ifb2) respectively from the auxiliary winding 413, the current sensing element 43 and the first and second isolated feedback units 61, 62. The control unit 63 generates a driving signal (DRIVE) in response to the auxiliary voltage (Vaux), the sensed voltage (Vcs) and the first and second feedback current inputs (Ifb1, Ifb2), and outputs the driving signal (DRIVE) to the switch 42, so as to control operation of the switch 42 between an ON state and an OFF state.

Figure 5:
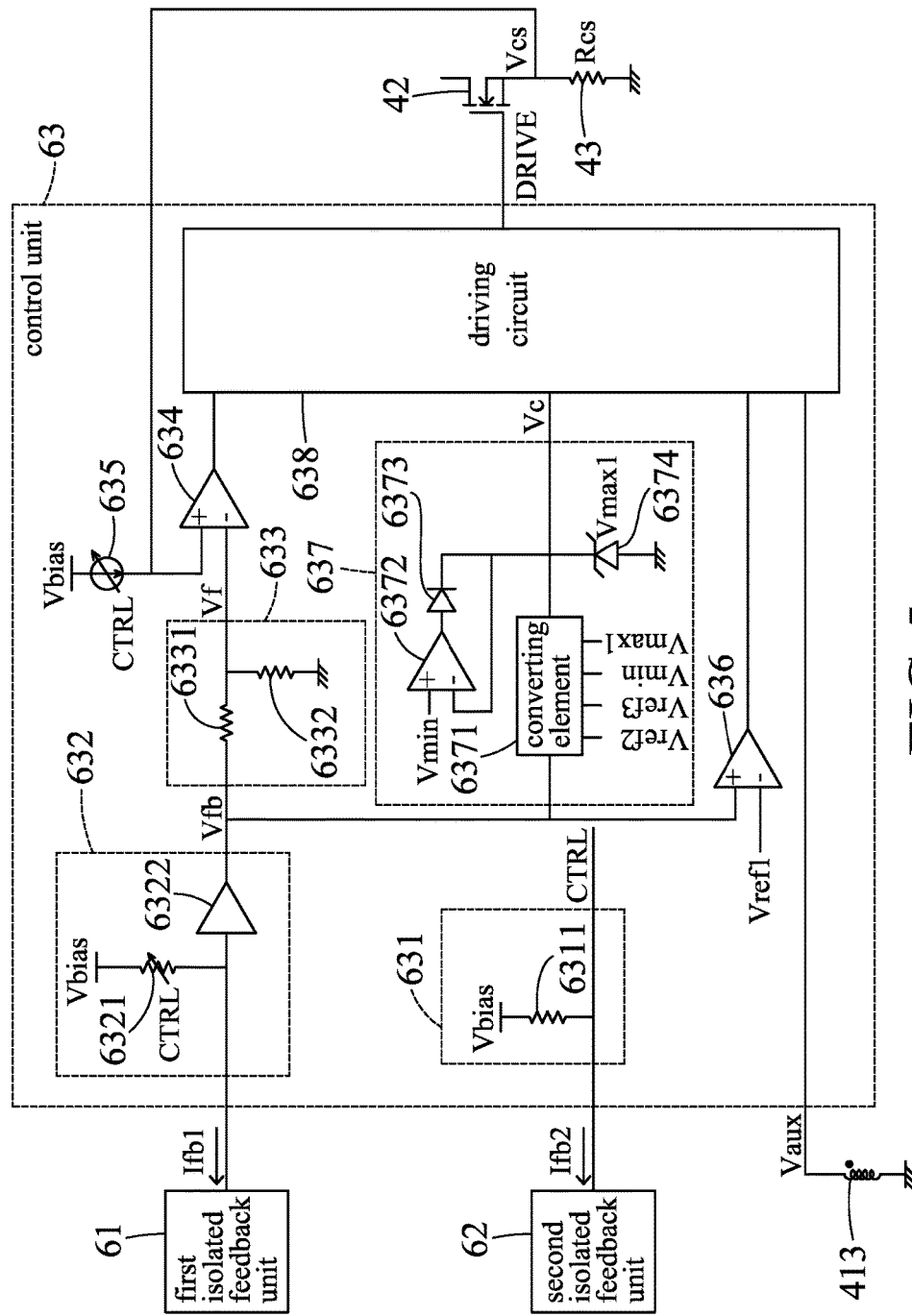
FIG. 5 is a circuit block diagram illustrating a control unit of the second control module of the first embodiment.

Referring to FIG. 5, in this embodiment, the control unit 63 includes an adjustment control circuit 631, a converting circuit 632, a scaling circuit 633, a first comparator 634, a current compensating circuit 635, a second comparator 636, a frequency control circuit 637 and a driving circuit 638.

The adjustment control circuit 631 is coupled to the second isolated feedback unit 62 for receiving the second feedback current input (Ifb2) therefrom, and generates a control signal (CTRL) in response to the second feedback current input (Ifb2). In this embodiment, the adjustment control circuit 631 includes a first resistor 6311. The first resistor 6311 has a first terminal that receives a bias voltage (Vbias), and a second terminal that is coupled to the second isolated feedback unit 62 for receiving the second feedback current input (Ifb2) therefrom and that provides the control signal (CTRL). The control signal (CTRL) is at a logic '0' level (also referred to as CTRL=0) when the output voltage (Vout) is relatively high (e.g., equals or approximates 20V), and is at a logic '1' level (also referred to as CTRL=1) when the output voltage (Vout) is relatively low (e.g., equals or approximates 5V).

Figure 6:
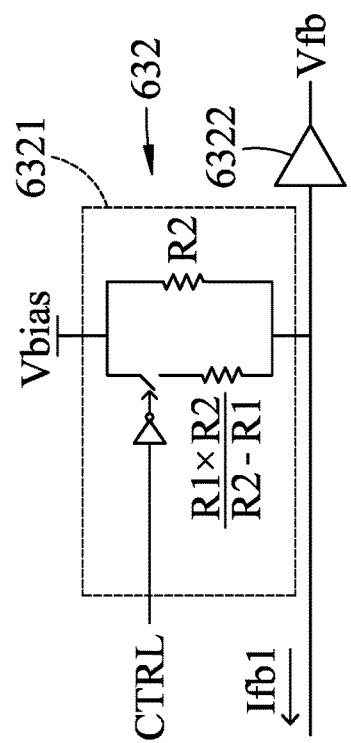
FIG. 6 is a circuit diagram illustrating a converting circuit of the control unit of the first embodiment.

The converting circuit 632 is coupled to the first isolated feedback unit 61 and the first resistor 6311 for receiving the first feedback current input (Ifb1) and the control signal (CTRL) respectively therefrom, and generates a feedback voltage (Vfb) in response to the first feedback current input (Ifb1) and the control signal (CTRL). In this embodiment, the converting circuit 632 includes a first variable resistor 6321 and a buffer 6322. The first variable resistor 6321 has a first terminal that receives the bias voltage (Vbias), a second terminal that is coupled to the first isolated feedback unit 61 for receiving the first feedback current input (Ifb1) therefrom, and a control terminal that is coupled to the first resistor 6311 for receiving the control signal (CTRL) therefrom. The buffer 6322 has an input terminal that is coupled to the second terminal of the first variable resistor 6321, and an output terminal that provides the feedback voltage (Vfb). In this embodiment, implementation of the first variable resistor 6321 is as shown in FIG. 6, in which the feedback voltage (Vfb) equals (Vbias−Ifb1×R1) when the control signal (CTRL) is at the logic '0' level, and equals (Vbias−Ifb1×R2) when the control signal (CTRL) is at the logic '1' level, where R1<R2.

The scaling circuit 633 is coupled to the buffer 6322 for receiving the feedback voltage (Vfb) therefrom, and scales the feedback voltage (Vfb) by a scaling factor of K to generate a scaled voltage (Vf), i.e., Vf=K×Vfb, where K is a constant. In this embodiment, the scaling circuit 633 includes a second resistor 6331 and a third resistor 6332 that are coupled in series between the output terminal of the buffer 6322 and the primary reference node, with the second resistor 6331 coupled to the output terminal of the buffer 6322 and the third resistor 6332 coupled to the primary reference node; the scaled voltage (Vf) is provided at a common node between the second and third resistors 6331, 6332; and 0<K<1.

The first comparator 634 has a first input terminal that is coupled to the current sensing element 43 for receiving the sensed voltage (Vcs) therefrom, a second input terminal that is coupled to the third resistor 6332 for receiving the scaled voltage (Vf) therefrom, and an output terminal that provides a result of comparison between the sensed voltage (Vcs) and the scaled voltage (Vf).

Figure 7:
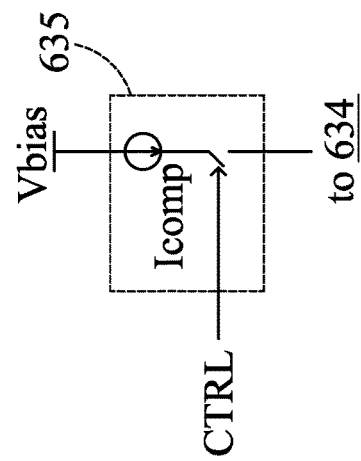
FIG. 7 is a circuit diagram illustrating a current compensating circuit of the control unit of the first embodiment.

The current compensating circuit 635 is coupled to the first resistor 6311 and the first input terminal of the first comparator 634, and receives the control signal (CTRL) from the first resistor 6311. The current compensating circuit 635 generates a compensating current input in response to the control signal (CTRL), and outputs the compensating current input to the first input terminal of the first comparator 634. In this embodiment, implementation of the current compensating circuit 635 is as shown in FIG. 7, in which the compensating current input is zero when the control signal (CTRL) is at the logic '0' level, and equals non-zero Icomp when the control signal (CTRL) is at the logic '1' level. It is noted that, in other embodiments, the current compensating circuit 635 may be omitted.

The second comparator 636 has a first input terminal that is coupled to the buffer 6322 for receiving the feedback voltage (Vfb) therefrom, a second input terminal that receives a first reference voltage (Vref1), and an output terminal that provides a result of comparison between the feedback voltage (Vfb) and the first reference voltage (Vref1).

Figure 8:
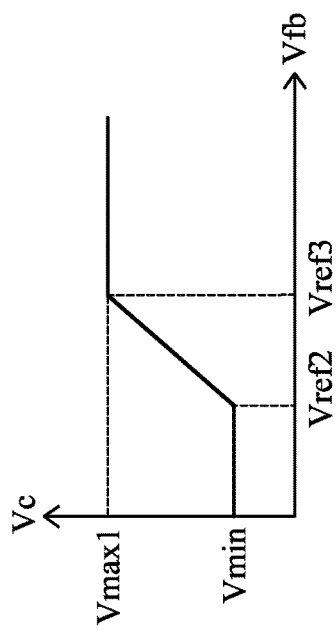
FIG. 8 is a plot illustrating control voltage versus feedback voltage characteristic of the first embodiment.

The frequency control circuit 637 is coupled to the buffer 6322 for receiving the feedback voltage (Vfb) therefrom, and generates a control voltage (Vc) in response to the feedback voltage (Vfb). In this embodiment, the frequency control circuit 637 includes a converting element 6371, an amplifier 6372, a diode 6373 and a first Zener diode 6374. The converting element 6371 is coupled to the buffer 6322 for receiving the feedback voltage (Vfb) therefrom, and further receives a second reference voltage (Vref2), a third reference voltage (Vref3), a minimum voltage (Vmin) and a first maximum voltage (Vmax1), where Vref2<Vref3 and Vmin<Vmax1. The converting element 6371 generates, in response to the feedback voltage (Vfb), on the second and third reference voltages (Vref2, Vref3), on the minimum voltage (Vmin) and on the first maximum voltage (Vmax1), the control voltage (Vc) that equals, for example, (Vmin+[(Vmax1−Vmin)/(Vref3−Vref2)]×(Vfb−Vref2)). The amplifier 6372 has a non-inverting input terminal that receives the minimum voltage (Vmin), an inverting input terminal that is coupled to the converting element 6371, and an output terminal. The diode 6373 has an anode that is coupled to the output terminal of the amplifier 6372, and a cathode that is coupled to the inverting input terminal of the amplifier 6372. The amplifier 6372 and the diode 6373 cooperate to make the control voltage (Vc) not lower than the minimum voltage (Vmin), i.e., Vc≥Vmin. The first Zener diode 6374 with a breakdown voltage equaling the first maximum voltage (Vmax1) has an anode that is coupled to the primary reference node, and a cathode that is coupled to the converting element 6371. The first Zener diode 6374 makes the control voltage (Vc) not higher than the breakdown voltage thereof, i.e., Vc≤Vmax1. Therefore, as shown in FIG. 8, the control voltage (Vc) equals the minimum voltage (Vmin) when the feedback voltage (Vfb) is lower than the second reference voltage (Vref2), increases from the minimum voltage (Vmin) to the first maximum voltage (Vmax1) linearly with increase of the feedback voltage (Vfb) when the feedback voltage (Vfb) is between the second and third reference voltages (Vref2, Vref3), and equals the first maximum voltage (Vmax1) when the feedback voltage (Vfb) is higher than the third reference voltage (Vref3). It is noted that, in other embodiments, the control voltage (Vc) may increase with the increase of the feedback voltage (Vfb) piecewise linearly or non-linearly when the feedback voltage (Vfb) is between the second and third reference voltages (Vref2, Vref3).

The driving circuit 638 is coupled to the auxiliary winding 413, the switch 42, the first and second comparators 634, 636 and the frequency control circuit 637, and receives the auxiliary voltage (Vaux), the results of the comparisons and the control voltage (Vc) respectively from the auxiliary winding 413, the first and second comparators 634, 636 and the frequency control circuit 637. The driving circuit 638 generates the driving signal (DRIVE) in response to the auxiliary voltage (Vaux), the results of the comparisons and the control voltage (Vc), and outputs the driving signal (DRIVE) to the switch 42, so as to control operation of the switch 42 between the ON state and the OFF state. When the result of the comparison from the second comparator 636 indicates that the feedback voltage (Vfb) is lower than the first reference voltage (Vref1), the switch 42 operates in the OFF state. When the result of the comparison from the second comparator 636 indicates that the feedback voltage (Vfb) is higher than the first reference voltage (Vref1), the switch 42 alternates between the ON state and the OFF state. The switch 42 transitions from the ON state to the OFF state upon the result of the comparison from the first comparator 634 indicating that the sensed voltage (Vcs) is higher than the scaled voltage (Vf). The switch 42 transitions from the OFF state to the ON state when a voltage across the switch 42 is determined, in response to the auxiliary voltage (Vaux), to reach its valley after a time period has passed, where the time period starts from the latest transition of the switch 42 from the OFF state to the ON state, and equals a reciprocal of a controlled frequency, which is a function of the control voltage (Vc), i.e., f(Vc). The controlled frequency increases with increase of the control voltage (Vc), and equals, for example, (a×Vc+b), where a and b are predetermined constants.

Figure 9:
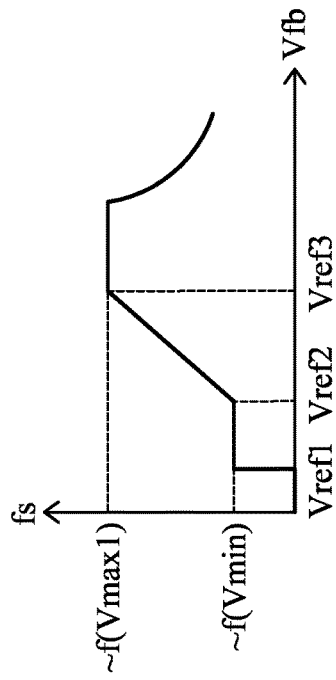
FIG. 9 is a plot illustrating switching frequency versus feedback voltage characteristic of the first embodiment.

As a result, the flyback converter 4 operates in a quasi-resonant mode, and a current flowing through the primary winding 411 (see FIG. 2) has a maximum that equals ((K×Vfb)/Rcs) when the control signal (CTRL) is at the logic '0' level, and that equals ((K×Vfb)/Rcs−Icomp) when the control signal (CTRL) is at the logic '1' level, where Rcs denotes a resistance of the current sensing element 43. In addition, as shown in FIG. 9, the switch 42 operates at a switching frequency (fs) that is zero when the feedback voltage (Vfb) is lower than the first reference voltage (Vref1), that approximates f(Vmin) when the feedback voltage (Vfb) is between the first and second reference voltages (Vref1, Vref2), that increases from approximating f(Vmin) to approximating f(Vmax1) with the increase of the feedback voltage (Vfb) when the feedback voltage (Vfb) is between the second and third reference voltages (Vref2, Vref3), and that approximates f(Vmax1) and then decreases therefrom with the increase of the feedback voltage (Vfb) when the feedback voltage (Vfb) is higher than the third reference voltage (Vref3).

Figure 10:
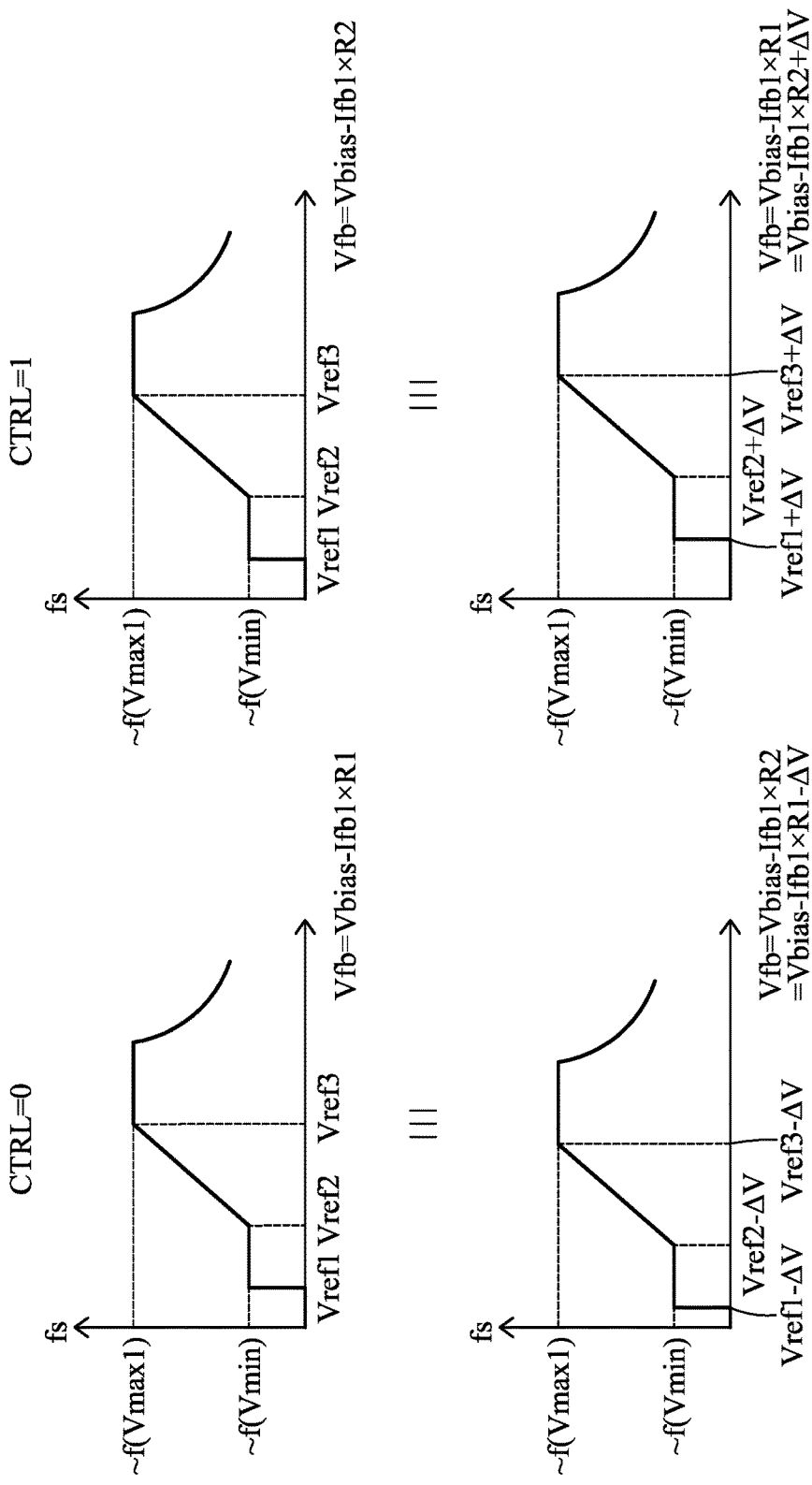
FIG. 10 is a plot illustrating switching frequency versus feedback voltage characteristic of the first embodiment in various conditions.

It is known from FIG. 10 that change of the feedback voltage (Vfb) due to the control signal (CTRL) equivalently results in lateral shift of a curve of the switching frequency (fs) with respect to the feedback voltage (Vfb). Therefore, the power supply apparatus of this embodiment can have relatively high conversion efficiency under various predetermined settings of the output voltage (Vout) and the loading (e.g., (Vout, loading)={(5V, 25%), (5V, 50%), (5V, 75%), (5V, 100%), (20V, 25%), (20V, 50%), (20V, 75%), (20V, 100%)}).

Referring back to FIGS. 1 and 2, it is noted that the control unit 63 of the second control module 6 and control logic of the first control module 5 may be fabricated in a single integrated circuit, thereby attaining small size and thus high power density of the power supply apparatus of this embodiment.

Figure 11:
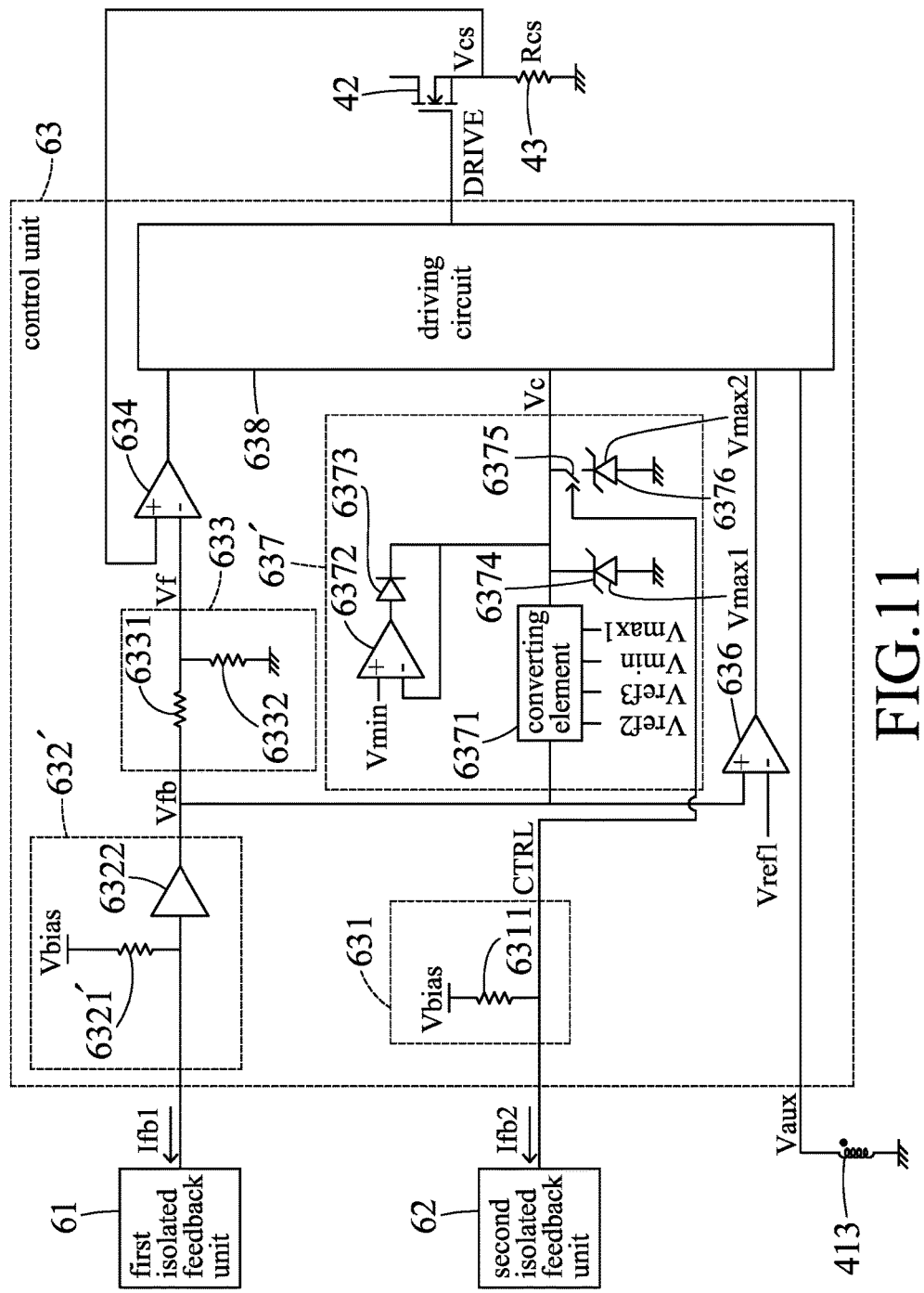
FIG. 11 is a circuit block diagram illustrating a control unit of a second embodiment of a power supply apparatus according to the disclosure.

Referring to FIG. 11, the second embodiment of a power supply apparatus according to the disclosure is a modification of the first embodiment, and differs from the first embodiment in that:

1. The connection of the converting circuit 632' to the first resistor 6311 is omitted, generation of the feedback voltage (Vfb) by the converting circuit 632' is not in response to the control signal (CTRL), and a fourth resistor 6321' is used to replace the first variable resistor 6321 (see FIG. 5).

2. The current compensating circuit 635 (see FIG. 5) is omitted.

3. The frequency control circuit 637' further includes a switch 6375 and a second Zener diode 6376 with a breakdown voltage equaling a second maximum voltage (Vmax2), where Vmin<Vmax2<Vmax1. The second Zener diode 6376 has an anode that is coupled to the primary reference node, and a cathode. The switch 6375 is coupled between the converting element 6371 and the cathode of the second Zener diode 6376, is coupled further to the first resistor 6311 for receiving the control signal (CTRL) therefrom, and operates between an ON state and an OFF state in response to the control signal (CTRL). The second Zener diode 6376 and the switch 6375 cooperate to selectively make the control voltage (Vc) not higher than the second maximum voltage (Vmax2) in response to the control signal (CTRL). With the first and second Zener diodes 6374, 6376 and the switch 6375, the control voltage (Vc) is not higher than the first maximum voltage (Vmax1) when the control signal (CTRL) is at the logic '0' level, and is not higher than the second maximum voltage (Vmax2) when the control signal (CTRL) is at the logic '1' level.

Figure 12:
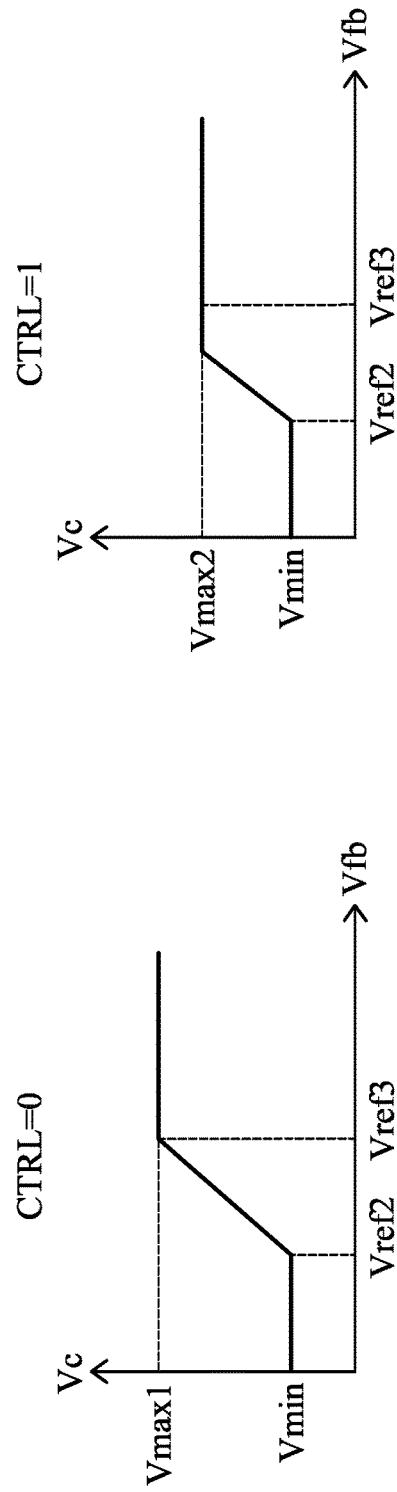
FIG. 12 is a plot illustrating control voltage versus feedback voltage characteristic of the second embodiment in various conditions.
Figure 13:
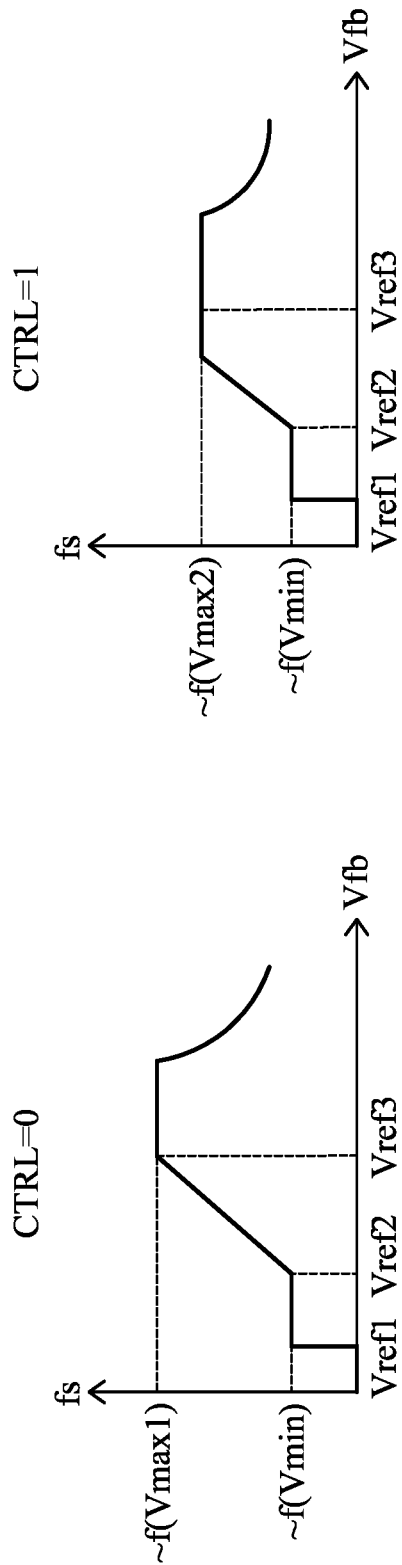
FIG. 13 is a plot illustrating switching frequency versus feedback voltage characteristic of the second embodiment in the various conditions.

As a result, control voltage (Vc) versus feedback voltage (Vfb) characteristic in the conditions of CTRL=0 and CTRL=1 is as shown in FIG. 12, and switching frequency (fs) versus feedback voltage (Vfb) characteristic in the conditions of CTRL=0 and CTRL=1 is as shown in FIG. 13.

It is known from FIGS. 12 and 13 that change of an upper limit of the control voltage (Vc) due to the control signal (CTRL) results in change of an upper limit of the switching frequency (fs) and thus the change of the curve of the switching frequency (fs) with respect to the feedback voltage (Vfb). Therefore, the power supply apparatus of this embodiment can have relatively high conversion efficiency under the various predetermined settings of the output voltage (Vout) and the loading.

Figure 14:
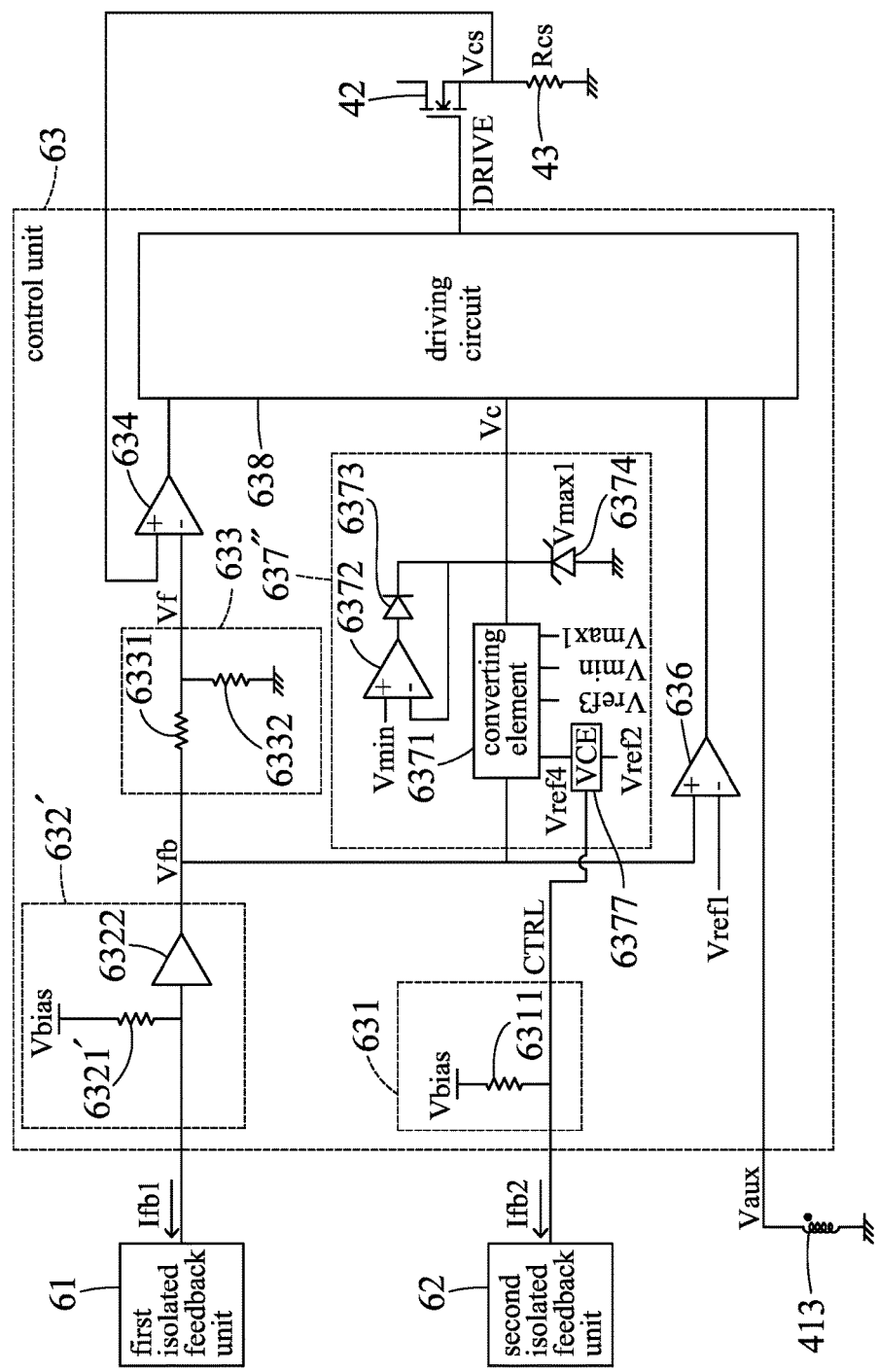
FIG. 14 is a circuit block diagram illustrating a control unit of a third embodiment of a power supply apparatus according to the disclosure.

Referring to FIG. 14, the third embodiment of a power supply apparatus according to the disclosure is a modification of the first embodiment, and differs from the first embodiment in that:

1. The connection of the converting circuit 632' to the first resistor 6311 is omitted, the generation of the feedback voltage (Vfb) by the converting circuit 632' is not in response to the control signal (CTRL), and a fourth resistor 6321' is used to replace the first variable resistor 6321 (see FIG. 5).

2. The current compensating circuit 635 (see FIG. 5) is omitted.

Figure 15:
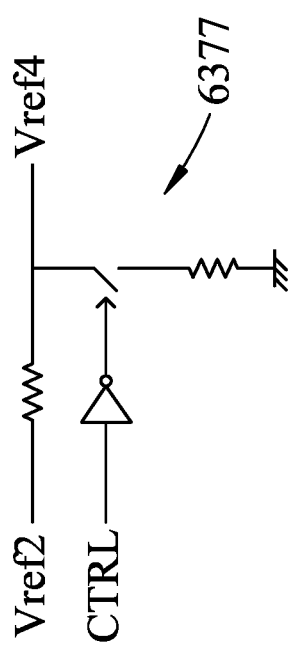
FIG. 15 is a circuit diagram illustrating a voltage compensating element of the control unit of the third embodiment.

3. The frequency control circuit 637'' further includes a voltage compensating element (VCE) 6377. The voltage compensating element 6377 is coupled to the first resistor 6311 for receiving the control signal (CTRL) therefrom, further receives the second reference voltage (Vref2), and generates a fourth reference voltage (Vref4) in response to the control signal (CTRL) and the second reference voltage (Vref2). The converting element 6371 generates, in response to the fourth reference voltage (Vref4) instead of the second reference voltage (Vref2), on the third reference voltage (Vref3), on the minimum voltage (Vmin) and on the first maximum voltage (Vmax1), the control voltage (Vc) that equals, for example, (Vmin+[(Vmax1−Vmin)/(Vref3−Vref4)]×(Vfb−Vref4)). In this embodiment, implementation of the voltage compensating element 6377 is as shown in FIG. 15, in which the fourth reference voltage (Vref4) is lower than the second reference voltage (Vref2) when the control signal (CTRL) is at the logic '0' level, and equals the second reference voltage (Vref2) when the control signal (CTRL) is at the logic '1' level. With the voltage compensating element 6377, the control voltage (Vc) generated by the converting element 6371 increases with the increase of the feedback voltage (Vfb), and equals the minimum voltage (Vmin) when the feedback voltage (Vfb) equals the fourth reference voltage (Vref4) that changes due to the control signal (CTRL).

Figure 16:
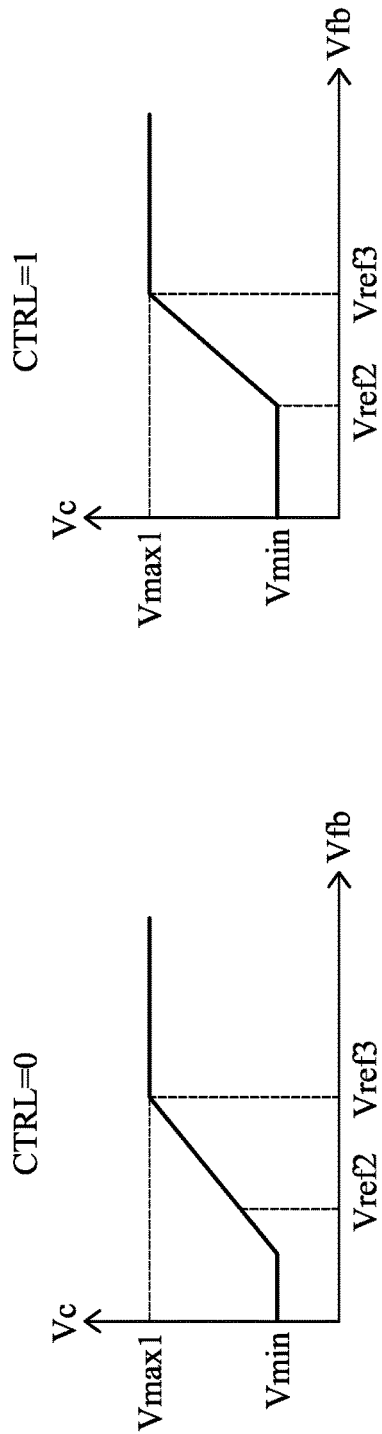
FIG. 16 is a plot illustrating control voltage versus feedback voltage characteristic of the third embodiment in various conditions.
Figure 17:
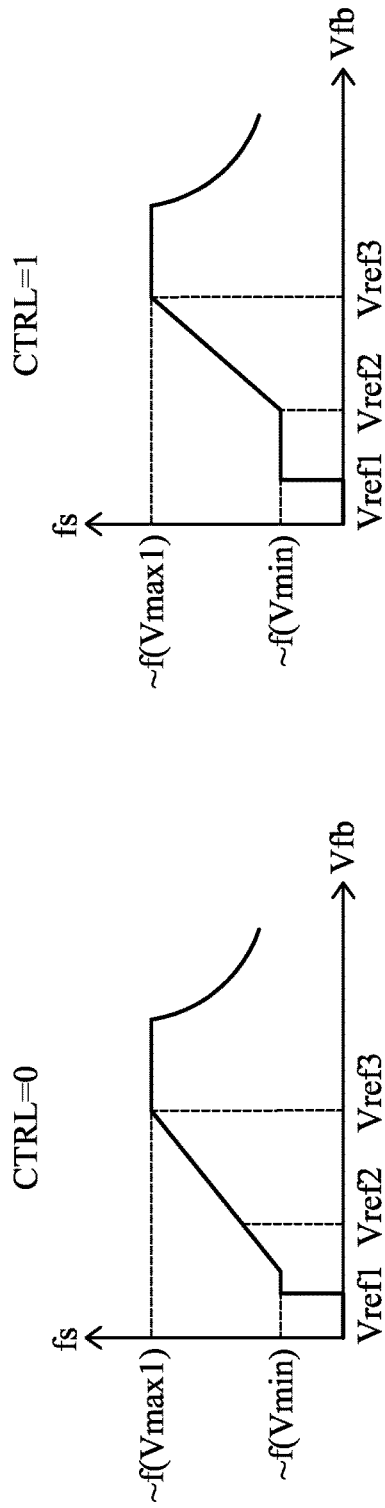
FIG. 17 is a plot illustrating switching frequency versus feedback voltage characteristic of the third embodiment in the various conditions.

As a result, control voltage (Vc) versus feedback voltage (Vfb) characteristic in the conditions of CTRL=0 and CTRL=1 is as shown in FIG. 16, and switching frequency (fs) versus feedback voltage (Vfb) characteristic in the conditions of CTRL=0 and CTRL=1 is as shown in FIG. 17.

It is known from FIGS. 16 and 17 that change of the fourth reference voltage (Vref4) due to the control signal (CTRL) results in change of a turning point of the curve of the switching frequency (fs) with respect to the feedback voltage (Vfb), where the turning point is associated with the second reference voltage (Vref2). Therefore, the power supply apparatus of this embodiment can have relatively high conversion efficiency under the various predetermined settings of the output voltage (Vout) and the loading.

It is noted that, in other embodiments, for the curve of the switching frequency (fs) with respect to the feedback voltage (Vfb), a turning point thereof associated with the third reference voltage (Vref3) instead of the second reference voltage (Vref2) or the turning points thereof associated with the second and third reference voltages (Vref2, Vref3) may be changed in accordance with the control signal (CTRL).

Figure 18:
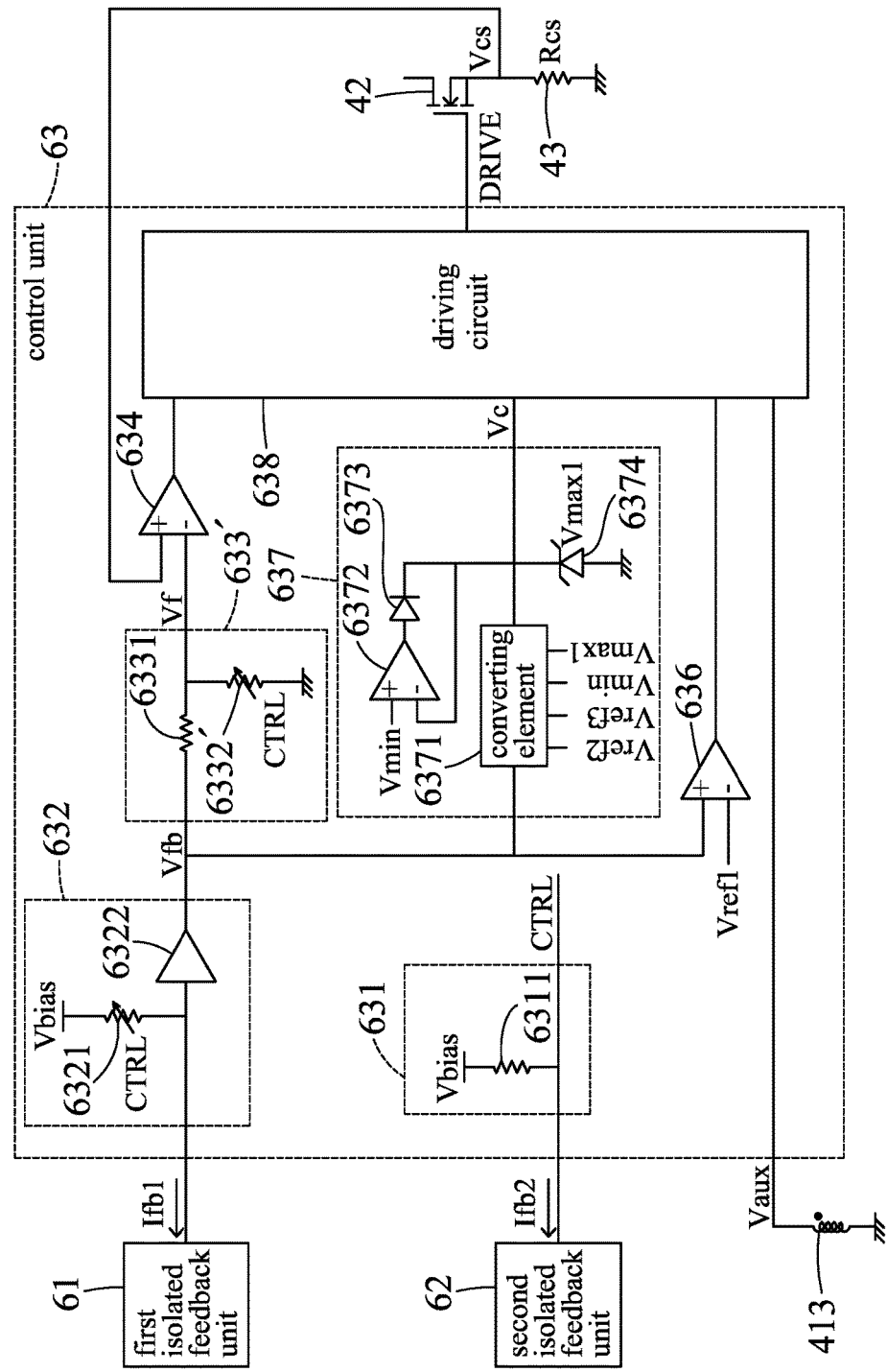
FIG. 18 is a circuit block diagram illustrating a control unit of a fourth embodiment of a power supply apparatus according to the disclosure.

Referring to FIG. 18, the fourth embodiment of a power supply apparatus according to the disclosure is a modification of the first embodiment, and differs from the first embodiment in that:

1. The current compensating circuit 635 (see FIG. 5) is omitted.

Figure 19:
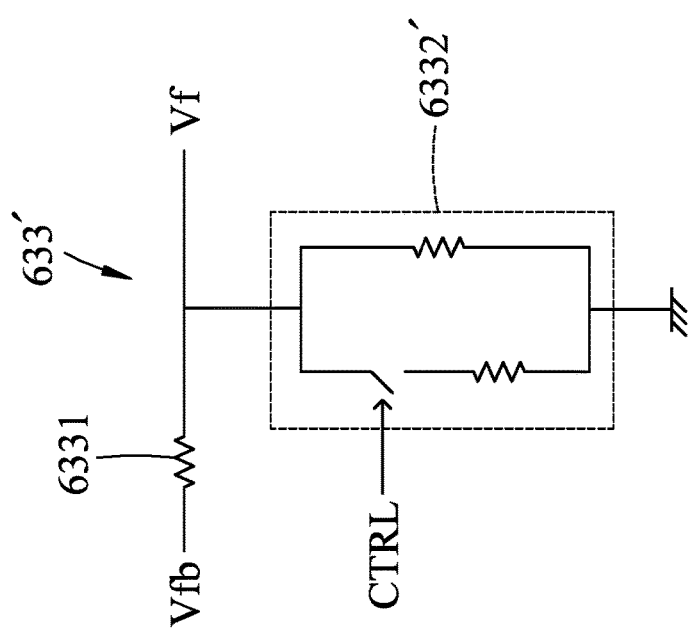
FIG. 19 is a circuit diagram illustrating a scaling circuit of the control unit of the fourth embodiment.

2. The scaling circuit 633' is coupled further to the first resistor 6311 for receiving the control signal (CTRL) therefrom, and the scaling factor changes due to the control signal (CTRL). The scaled voltage (Vf) equals (K1×Vfb) when the control signal (CTRL) is at the logic '0' level, and equals (K2×Vfb) when the control signal (CTRL) is at the logic '1' level, where K1 and K2 are constants and K1>K2. In this embodiment, a second variable resistor 6332' is used to replace the third resistor 6332 (see FIG. 5), and has a first terminal that is coupled to the second resistor 6331, a second terminal that is coupled to the primary reference node, and a control terminal that is coupled to the first resistor 6311 for receiving the control signal (CTRL) therefrom. In this embodiment, implementation of the second variable resistor 6332' is as shown in FIG. 19.

Figure 20:
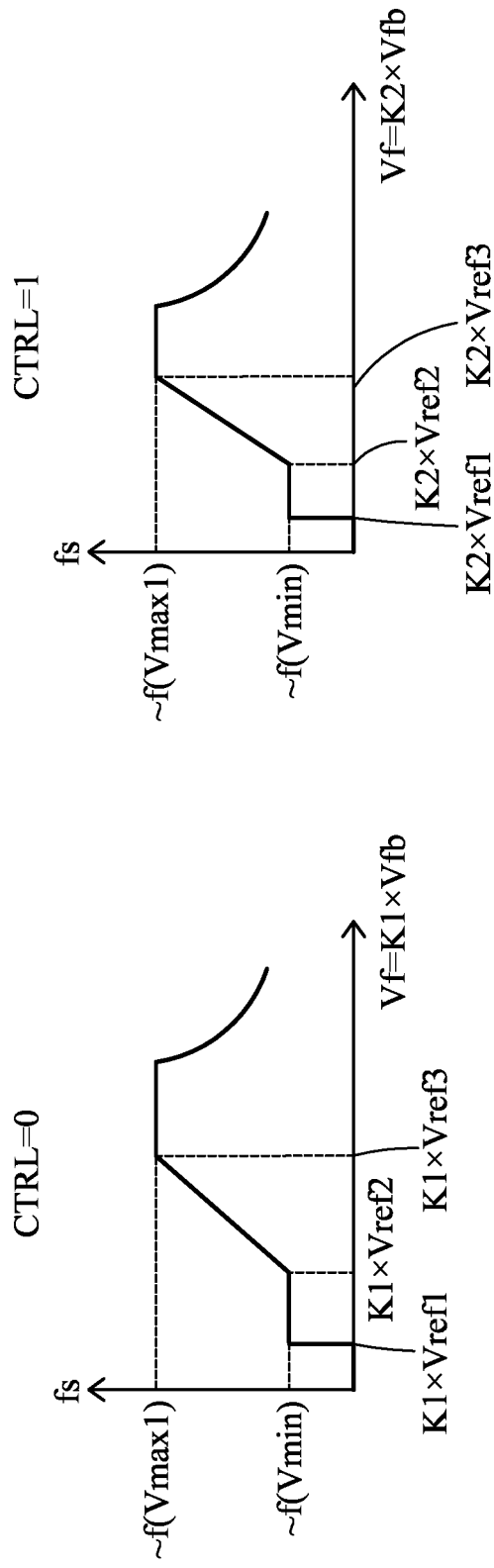
FIG. 20 is a plot illustrating switching frequency versus scaled voltage characteristic of the fourth embodiment in various conditions.

As a result, switching frequency (fs) versus feedback voltage (Vfb) characteristic in the conditions of CTRL=0 and CTRL=1 is as shown in FIG. 10, and switching frequency (fs) versus scaled voltage (Vf) characteristic in the conditions of CTRL=0 and CTRL=1 is as shown in FIG. 20.

It is known from FIGS. 10 and 20 that change of the feedback voltage (Vfb) due to the control signal (CTRL) equivalently results in lateral shift of the curve of the switching frequency (fs) with respect to the feedback voltage (Vfb), and that change of the scaled voltage (Vf) due to the control signal (CTRL) results in lateral scaling of the curve of the switching frequency (fs) with respect to the scaled voltage (Vf). Therefore, the power supply apparatus of this embodiment can have relatively high conversion efficiency under the various predetermined settings of the output voltage (Vout) and the loading.

It is noted that, in other embodiments, a variable resistor may be used to replace the second resistor 6331 (see FIG. 5) instead of the third resistor 6332 (see FIG. 5).

It is noted that, in other embodiments, any combination of the aforesaid techniques that are used to change the feedback voltage (Vfb), the curve of the switching frequency (fs) with respect to the feedback voltage (Vfb) and the curve of the switching frequency (fs) with respect to the scaled voltage (Vf) may be utilized.

In the description above, for the purposes of explanation, numerous specific details have been set forth in order to provide a thorough understanding of the embodiment(s). It will be apparent, however, to one skilled in the art, that one or more other embodiments may practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connect ion with what is (are) considered the exemplary embodiment(s), it is understood that the disclosure is not limited to the disclosed embodiment(s) but is intended to cover various arrangements included within the spirit and scope of the broadest interpretation so as to encompass all such modifications and equivalent arrangements.

What is claimed is:

1. A power supply apparatus comprising:
   a flyback converter receiving a bulk voltage, generating an output voltage in response to the bulk voltage, and including a transformer that includes a primary winding and a secondary winding, and a switch coupled to the primary winding, the output voltage being stabilized at one of a plurality of predetermined voltage values alternatively selected therefor; and
   a controller coupled to said flyback converter for receiving the output voltage therefrom, and generating, in response to the output voltage, a control signal associated with the selection of the predetermined voltage values;
   said controller executing based at least on the output voltage and the control signal, said controller generating a feedback voltage associated with loading of the power supply apparatus, and controlling said switch in such a manner that said switch operates at a switching frequency associated with the feedback voltage, and that at least one of the feedback voltage or a curve of the switching frequency with respect to the feedback voltage changes responsive to the control signal;
   said controller including:
      a first isolated feedback unit coupled to said flyback converter for receiving the output voltage therefrom, and generating, in response to the output voltage, a first feedback current input associated with the loading;
      a second isolated feedback unit coupled to said flyback converter for receiving the output voltage therefrom, and generating, in response to the output voltage, a second feedback current input associated with the selection of the predetermined voltage values; and
      a control unit coupled to said switch and said first and second isolated feedback units, receiving the first and second feedback current inputs respectively from said first and second isolated feedback units, and generating the control signal in response to the second feedback current input, based at least on the first feedback current input and the control signal, said control unit generating the feedback voltage and controlling said switch.

2. The power supply apparatus of claim 1, wherein the feedback voltage changes due to the control signal.

3. The power supply apparatus of claim 1, wherein the switching frequency has an upper limit that changes due to the control signal.

4. The power supply apparatus of claim 1, wherein the curve of the switching frequency with respect to the feedback voltage has a turning point that changes due to the control signal.

5. The power supply apparatus of claim 1, wherein said control unit includes:
   an adjustment control circuit coupled to said second isolated feedback unit for receiving the second feedback current input therefrom, and generating the control signal in response to the second feedback current input;
   a converting circuit coupled to said first isolated feedback unit and said adjustment control circuit for receiving the first feedback current input and the control signal respectively therefrom, and generating the feedback voltage in response to the first feedback current input and the control signal;
   a frequency control circuit coupled to said converting circuit for receiving the feedback voltage therefrom, and generating a control voltage in response to the feedback voltage; and
   a driving circuit coupled to said switch and said frequency control circuit, receiving the control voltage from said frequency control circuit, and generating, based at least on the control voltage, a driving signal for controlling said switch.

6. The power supply apparatus of claim 5, wherein:
   said flyback converter further includes a current sensing element that is coupled to said switch and that senses a current flowing through said switch to generate a sensed voltage;
   said control unit further includes:
      a scaling circuit coupled to said converting circuit for receiving the feedback voltage therefrom, and scaling the feedback voltage by a scaling factor to generate a scaled voltage, and a first comparator having a first input terminal that is coupled to said current sensing element for receiving the sensed voltage therefrom, a second input terminal that is coupled to said scaling circuit for receiving the scaled voltage therefrom, and an output terminal that provides a result of comparison between the sensed voltage and the scaled voltage; and said driving circuit is coupled further to said first comparator for receiving the result of the comparison therefrom, and generates the driving signal based further on the result of the comparison from said first comparator.

7. The power supply apparatus of claim 6, wherein the scaling factor is a constant.

8. The power supply apparatus of claim 6, wherein said scaling circuit is coupled further to said adjustment control circuit for receiving the control signal therefrom, and the scaling factor changes due to the control signal.

9. The power supply apparatus of claim 6, wherein said control unit further includes a current compensating circuit that is coupled to said adjustment control circuit and said first input terminal of said first comparator, that receives the control signal from said adjustment control circuit, that generates a compensating current input in response to the control signal, and that outputs the compensating current input to said first input terminal of said first comparator.

10. The power supply apparatus of claim 6, wherein:
said control unit further includes a second comparator having a first input terminal that is coupled to said converting circuit for receiving the feedback voltage therefrom, a second input terminal that receives a reference voltage, and an output terminal that provides a result of comparison between the feedback voltage and the reference voltage; and said driving circuit is coupled further to said second comparator for receiving the result of the comparison therefrom, and generates the driving signal based further on the result of the comparison from said second comparator.

11. The power supply apparatus of claim 10, wherein:
when the result of the comparison from said second comparator indicates that the feedback voltage is lower than the reference voltage, said switch operates in an OFF state; and
when the result of the comparison from said second comparator indicates that the feedback voltage is higher than first reference voltage, said switch alternates between an ON state and the OFF state.

12. The power supply apparatus of claim 11, wherein said switch transitions from the ON state to the OFF state upon the result of the comparison from said first comparator indicating that the sensed voltage is higher than the scaled voltage.

13. The power supply apparatus of claim 12, wherein:
said transformer further includes an auxiliary winding that provides an auxiliary voltage; and
said driving circuit is coupled further to said auxiliary winding for receiving the auxiliary voltage therefrom, and generates the driving signal based further on the auxiliary voltage.

14. The power supply apparatus of claim 13, wherein said switch transitions from the OFF state to the ON when a voltage across said switch is determined, in response to the auxiliary voltage, to reach a valley thereof after a time period has passed, where the time period starts from the latest transition of said switch from the OFF state to the ON state, and equals a reciprocal of a controlled frequency that is a function of the control voltage.

15. The power supply apparatus of claim 5, wherein said frequency control circuit generates the control voltage increasing with increase of the feedback voltage, and makes the control voltage not lower than a minimum voltage and not higher than a maximum voltage, where the minimum voltage is lower than the maximum voltage.

16. The power supply apparatus of claim 1, wherein said control unit includes:
an adjustment control circuit coupled to said second isolated feedback unit for receiving the second feedback current input therefrom, and generating the control signal in response to the second feedback current input;
a converting circuit coupled to said first isolated feedback unit for receiving the first feedback current input therefrom, and generating the feedback voltage in response to the first feedback current input;
a frequency control circuit coupled to said adjustment control circuit and said converting circuit for receiving the control signal and the feedback voltage respectively therefrom, and generating a control voltage in response to the control signal and the feedback voltage; and
a driving circuit coupled to said switch and said frequency control circuit, receiving the control voltage from said frequency control circuit, and generating, in response to the control voltage, a driving signal for controlling said switch.

17. The power supply apparatus of claim 16, wherein said frequency control circuit generates the control voltage increasing with increase of the feedback voltage, makes the control voltage not lower than a minimum voltage and not higher than a first maximum voltage, and is operable to make the control voltage not higher than a second maximum voltage in response to the control signal, where the second maximum voltage is higher than the minimum voltage and lower than the first maximum voltage.

18. The power supply apparatus of claim 16, wherein said frequency control circuit generates the control voltage that increases with increase of the feedback voltage, and that equals a minimum voltage when the feedback voltage equals a reference voltage which changes due to the control signal, and said frequency control circuit makes the control voltage not lower than the minimum voltage and not higher than a maximum voltage, where the minimum voltage is lower than the maximum voltage.

19. The power supply apparatus of claim 1, further includes:
an EMI (electromagnetic interference) filter used to receive an input voltage, and filtering the input voltage to generate a filtered voltage;
a rectifier coupled to said EMI filter for receiving the filtered voltage therefrom, and rectifies the filtered voltage to generate a rectified voltage; and
a power factor corrector coupled to said rectifier and said flyback converter, receiving the rectified voltage from said rectifier, and generating, in response to the rectified voltage, the bulk voltage for said flyback converter.

* * * * *